United States Patent
Katou et al.

(10) Patent No.: US 11,177,381 B2
(45) Date of Patent: Nov. 16, 2021

(54) SEMICONDUCTOR DEVICE AND METHOD FOR MANUFACTURING SAME

(71) Applicants: Kabushiki Kaisha Toshiba, Tokyo (JP); Toshiba Electronic Devices & Storage Corporation, Tokyo (JP)

(72) Inventors: Hiroaki Katou, Nonoichi Ishikawa (JP); Kenya Kobayashi, Nonoichi Ishikawa (JP); Tatsuya Nishiwaki, Komatsu Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/813,177

(22) Filed: Mar. 9, 2020

(65) Prior Publication Data
US 2021/0083103 A1    Mar. 18, 2021

(30) Foreign Application Priority Data
Sep. 13, 2019 (JP) .............................. JP2019-166906

(51) Int. Cl.
*H01L 29/66* (2006.01)
*H01L 29/78* (2006.01)
*H01L 29/423* (2006.01)

(52) U.S. Cl.
CPC ...... *H01L 29/7813* (2013.01); *H01L 29/4236* (2013.01); *H01L 29/42368* (2013.01); *H01L 29/66734* (2013.01)

(58) Field of Classification Search
CPC ....... H01L 29/66; H01L 29/78; H01L 29/423; H01L 29/4236; H01L 29/42368;
(Continued)

(56) References Cited

U.S. PATENT DOCUMENTS 8,207,612 B2 * 6/2012 Torii ...................... H01L 24/05
257/773
9,224,823 B2   12/2015 Katoh et al.
(Continued)

FOREIGN PATENT DOCUMENTS

| JP | 4951982 B2 | 6/2012 |
| JP | 2014-187141 A | 10/2014 |
| JP | 2015-115611 A | 6/2015 |

OTHER PUBLICATIONS

Masahiro Susa et al., "Progress Review Status of Basic Research on Thermal Oxidation of Si Wafer," The Japan Institute of Metals and Materials, vol. 27, No. 4, 1988 (with Machine Translation).

*Primary Examiner* — Chuong A Luu
(74) *Attorney, Agent, or Firm* — Allen & Overy, LLP (57) ABSTRACT

A semiconductor device includes a semiconductor part, a first electrode, a plurality of control electrodes and a second electrode. The semiconductor part has a plurality of first trenches and a second trench. The plurality of first trenches are spaced from each other and arranged around the second trench. The first electrode is provided above the semiconductor part. The first electrode is provided over the plurality of first trenches and the second trench. The control electrodes are provided in the first trenches, respectively. The control electrodes each are electrically isolated from the semiconductor part by a first insulating film. The second electrode is provided in the second trench. The second electrode is electrically isolated from the semiconductor part by a second insulating film and electrically connected to the first electrode.

13 Claims, 11 Drawing Sheets

(58) Field of Classification Search
CPC .......... H01L 29/7813; H01L 29/66734; H01L 29/04; H01L 29/06; H01L 29/401; H01L 29/407; H01L 29/0696; H01L 29/42364; H01L 29/66477; H01L 29/7825; H01L 29/66613; H01L 29/66628; H01L 29/42336; H01L 29/42352; H01L 29/7831; H01L 29/7832; H01L 29/66484; H01L 29/66704; H01L 29/7802; H01L 29/7815; H01L 29/7397; H01L 21/8234; H01L 21/8238; H01L 21/823475; H01L 21/823871
USPC ........................................................ 257/288
See application file for complete search history.

(56) References Cited

U.S. PATENT DOCUMENTS

| | | |
|---|---|---|
| 2015/0171174 A1 | 6/2015 | Georgescu et al. |
| 2018/0069087 A1 | 3/2018 | Georgescu et al. |
| 2019/0097030 A1* | 3/2019 | Miyata ................ H01L 29/0696 |
| 2021/0074848 A1* | 3/2021 | Katou ................. H01L 29/0696 |

* cited by examiner

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2019-166906, filed on Sep. 13, 2019; the entire contents of which are incorporated herein by reference.

FIELD

Embodiments relate to a semiconductor device and a method for manufacturing the same.

BACKGROUND

In a semiconductor device with a trench gate structure, a thermally oxidized film is often used as a gate insulating film provided between a semiconductor layer and a gate electrode. The thermally oxidized film, however, has the thickness that varies depending on a crystal orientation of a semiconductor surface that is exposed at the inner surface of the gate trench.

Thus, the gate electrode may include a portion having a threshold voltage locally different from other.

BRIEF DESCRIPTION OF THE DRAWINGS

FIGS. 3A to 10B are schematic views showing a manufacturing process of the semiconductor device according to the embodiment.

DETAILED DESCRIPTION

According to one embodiment, a semiconductor device includes a semiconductor part, a first electrode, a plurality of control electrodes and a second electrode. The semiconductor part has a plurality of first trenches and a second trench. The plurality of first trenches are spaced from each other and arranged around the second trench. The first electrode is provided above the semiconductor part. The first electrode is provided over the plurality of first trenches and the second trench. The control electrodes are provided in the first trenches, respectively. The control electrodes are electrically isolated from the semiconductor part by a first insulating film. The second electrode is provided in the second trench. The second electrode is electrically isolated from the semiconductor part by a second insulating film and electrically connected to the first electrode. The semiconductor part includes a first semiconductor layer of a first conductivity type, a second semiconductor layer of a second conductivity type and a third semiconductor layer of the first conductivity type. The second semiconductor layer is provided between the first semiconductor layer and the first electrode. The second semiconductor layer faces the plurality of control electrodes with the first insulating layer interposed. The third semiconductor layer is selectively provided between the second semiconductor layer and the first electrode. The third semiconductor layer contacts the first insulating film, and is electrically connected to the first electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
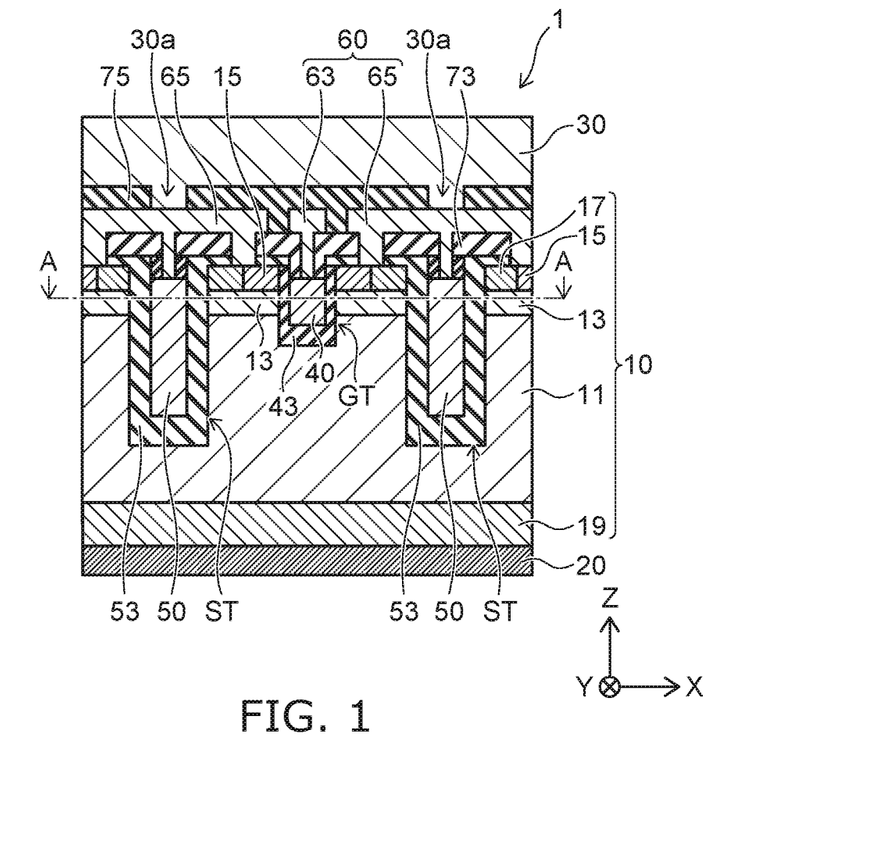
FIG. 1 is a schematic cross-sectional view showing a semiconductor device according to an embodiment.
Figure 2A:
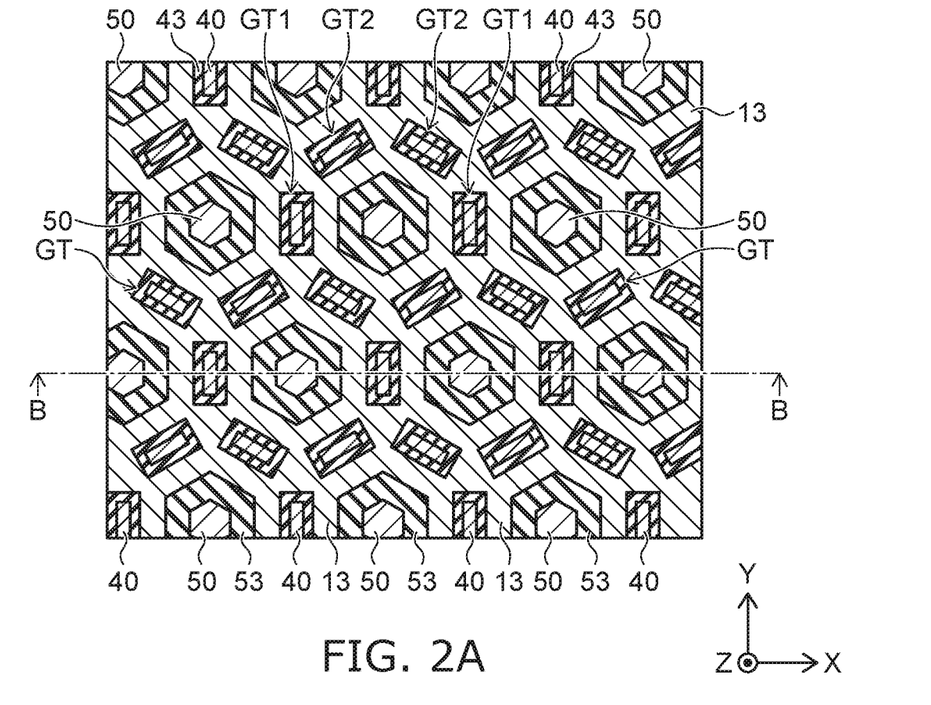
FIGS. 2A and 2B are other schematic views showing the semiconductor device according to the embodiment.
Figure 2B:
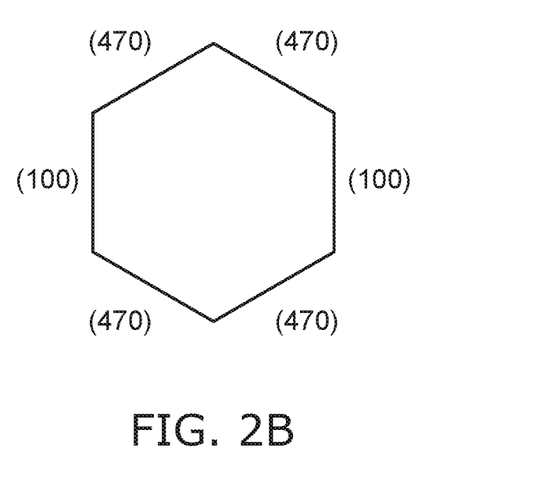

FIGS. 1, 2A and 2B are schematic views showing a semiconductor device 1 according to an embodiment. FIG. 1 is a schematic view illustrating cross-section along B-B line shown in FIG. 2A. FIG. 2A is a schematic view illustrating cross-section along A-A line shown in FIG. 1. The semiconductor device 1 is, for example, a trench gate type MOSFET.

As shown in FIG. 1, the semiconductor device 1 includes a semiconductor part 10, a drain electrode 20, a source electrode 30, a gate electrode 40 and a field electrode 50 (hereinafter referred to as FE 50). The semiconductor part 10 provided between the drain electrode 20 and the source electrode 30. The FE 50 provides the electric field in the semiconductor part 10 with the desired distribution thereof.

The gate electrode 40 and the FE 50 are positioned between the semiconductor part 10 and the source electrode 30. The gate electrode 40 is disposed inside the gate trench GT provided in the semiconductor part 10. The FE 50 is disposed inside the source trench ST provided in the semiconductor part 10.

The gate electrode 40 is electrically isolated from the semiconductor part 10 by a gate insulating film 43. The FE 50 is electrically isolated from the semiconductor part 10 by a field electrode insulating film (hereinafter referred to as a FE insulating film 53).

The semiconductor part 10 is, for example, silicon. The semiconductor part 10 includes, for example, an n-type drift layer 11, a p-type diffusion layer 13, an n-type source layer 15, a p-type contact layer 17, and an n-type drain layer 19.

The n-type drift layer 11 extends, for example, along the drain electrode 20 in the entire semiconductor part 10. The n-type drift layer 11 includes a n-type impurity with a low concentration. The p-type diffusion layer 13 is provided between the n-type drift layer 11 and the source electrode 30. The p-type diffusion layer 13 includes a p-type impurity with a concentration higher than the concentration of the n-type impurity in the n-type drift layer 11.

The n-type source layer 15 and the p-type contact layer 17 are selectively provided between the p-type diffusion layer 13 and the source electrode 30, respectively. The n-type source layer 15 is provided to be in contact with the gate insulating film 43. The p-type contact layer 17 is provided to be in contact with the FE insulating film 53. The n-type source layer 15 includes an n-type impurity with a concentration higher than the concentration of the n-type impurity in the n-type drift layer 11. The p-type contact layer 17 includes a p-type impurity with a concentration higher than a concentration of the p-type impurity in the p-type diffusion layer 13.

The n-type drain layer 19 is provided between the n-type drift layer 11 and the drain electrode 20. The n-type drain layer 19 includes an n-type impurity with a concentration higher than the concentration of the n-type impurity in the n-type drift layer 11. For example, the drain electrode 20 is in contact with the n-type drain layer 19 and electrically connected thereto.

The semiconductor device 1 further includes an interconnect layer 60. The interconnect layer 60 is provided between the semiconductor part 10 and the source electrode 30. An interlayer insulating film 73 is provided between the semiconductor part 10 and the interconnect layer 60. An interlayer insulating film 75 is provided between the source electrode 30 and the interconnect layer 60.

The interconnect layer 60 includes a gate interconnect 63 and a source interconnect 65. The gate interconnect 63 is electrically connected to the gate electrode 40. For example, the gate interconnect 63 is connected to the gate electrode 40 through a contact hole of the interlayer insulating film 73.

The source interconnect 65 is electrically connected to the n-type source layer 15, the p-type contact layer 17 and the FE 50, The source interconnect 65 includes a portion connected to the n-type source layer 15 and the p-type contact layer 17 and another portion connected to the FE 50. The portion extends to the n-type source layer 15 and the p-type contact layer 17 through the interlayer insulating film 73. Another portion extends to the FE 50 through the interlayer insulating film 73.

The source electrode 30 is electrically connected to the source interconnect 65 via the contact portion 30*a*. The contact portion 30*a* extends through the interlayer insulating film 75, and is connected to the source interconnect 65.

The gate interconnect 63 is electrically isolated from the source electrode 30 by the interlayer insulating film 75, The gate interconnect 63 is electrically connected to, for example, a gate pad provided on a portion of the semiconductor part 10 (not shown).

As shown in FIG. 2A, the semiconductor device 1 includes multiple FEs 50. For example, each FE 50 is provided with a columnar shape and extends into the semiconductor part 10. In the cross section shown in FIG. 2A, each of the FEs 50 is surrounded by the FE insulating film 53.

The semiconductor device 1 includes multiple gate electrodes 40. Each gate electrode 40 is electrically isolated from the semiconductor part 10 by the gate insulating film 43. The p-type diffusion layer 13 faces each of the gate electrodes 40 with the gate insulating film 43 interposed. The multiple gate electrodes 40 are spaced apart from each other. Each of the gate electrodes 40 is provided between the adjacent FEs 50. The gate electrodes 40 are provided in multiple gate trenches GT, respectively. For example, the gate electrodes 40 are provided around the FEs 50 so that six gate electrodes 40 surround one FE 50.

FIG. 2B is a schematic diagram showing the crystal orientation of the surfaces exposed at the inner wall of the gate trench GT in the semiconductor part 10. The gate trench GT is provided to extend along, for example, the sides of regular hexagon. The multiple gate trenches GT include, for example, a gate trench GT1 and a gate trench GT2. For example, the gate trench GT1 includes the inner surfaces exposed therein, which are equivalent to the (100) crystal plane. In contrast, the gate trench GT2 includes the inner surfaces exposed therein, which are equivalent to, for example, the (470) crystal plane. Here, the (470) crystal plane is defined to be a higher-order crystal plane than the (100) crystal plane.

Figure 11:
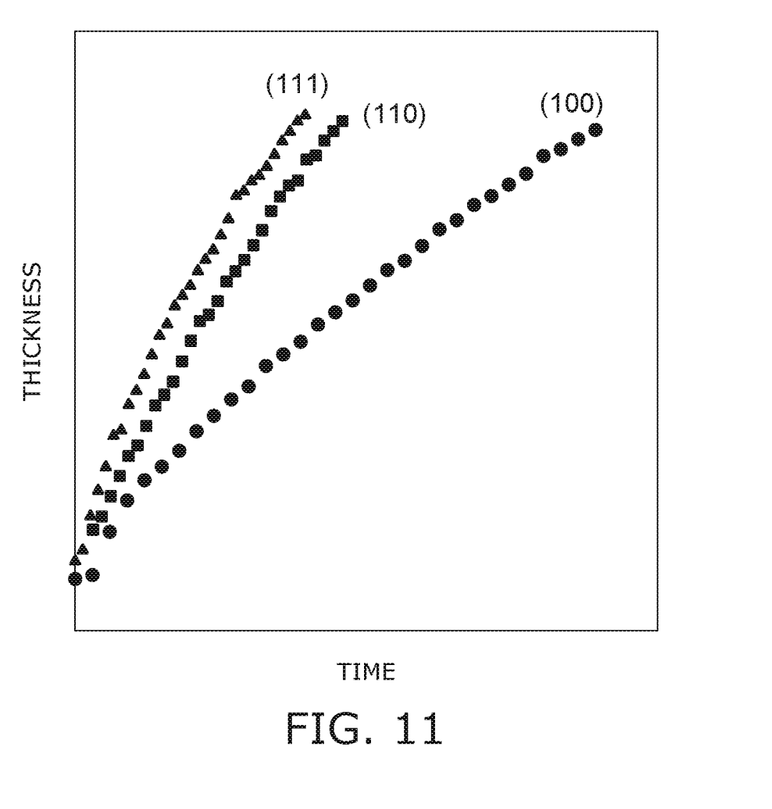
FIG. 11 is a graph showing characteristics of a thermally oxidized film according to the embodiment.

FIG. 11 is a graph showing the characteristics of a thermal oxide film of silicon (quoted from Bulletin of the Japanese Institute of Metals Vol. 27, No. 4 (1988)). The horizontal axis represents the thermal oxidation time, and the vertical axis represents the film thickness of the thermal oxide film. As shown in FIG. 11, the film thickness of the thermal oxide film on the (111) plane and the (110) plane is larger than the film thickness of the thermal oxide film on the (100) plane. In other words, the thermal oxidation rate of silicon is larger as the order of crystal plane is higher. Thus, in the case where the thermal oxidization is performed simultaneously, the thickness of thermally oxidized silicon oxide film is thicker on the higher-order crystal plane.

When the multiple gate trenches GT are arranged as shown in FIG. 2A, the thermal oxide film formed inside the gate trench GT2 has a thickness larger than a thickness of the thermal oxide film formed inside the gate trench GT1. Thus, the gate electrode 40 provided in the gate trench GT2 has a threshold voltage higher than a threshold voltage of the gate electrode 40 provided in the gate trench GT1.

In the semiconductor device 1 according to the embodiment, the gate insulating films are uniformly formed in the gate trenches GT1 and GT2 using the manufacturing method described below. Thereby, it is possible in the semiconductor device 1 to suppresses the variations of the gate threshold voltages.

FIGS. 3A to 10B are schematic views showing a manufacturing process of the semiconductor device 1 according to the embodiment. FIGS. 3A to 10B are cross sectional views of the semiconductor wafer 100 other than FIGS. 4B, 6B and 9B. FIGS. 4B, 6B, and 9B are plan views illustrating the front surface of the semiconductor wafer 100.

Figure 3A:
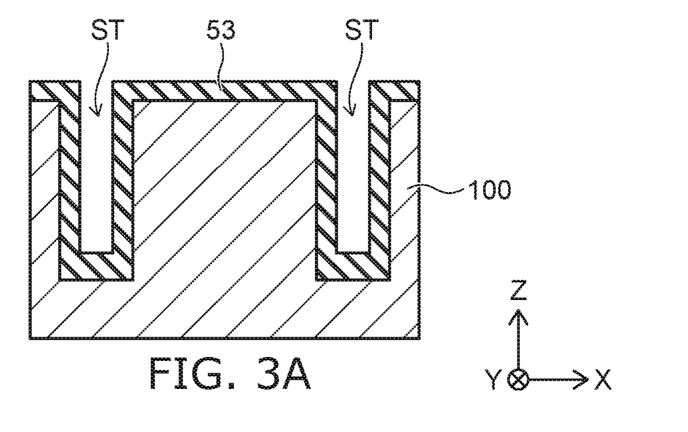

As shown in FIG. 3A, the FE insulating film 53 is formed to cover the front surface of the semiconductor wafer 100 and the inner surfaces of the source trenches ST after the source trenches ST are formed in the semiconductor wafer 100. The semiconductor wafer is, for example, an n-type silicon wafer.

The source trenches ST are formed by selectively removing the semiconductor wafer using, for example, anisotropic RIE (Reactive Ion Etching). The FE insulating film 53 is formed, for example, by thermally oxidizing the semiconductor wafer 100. The FE insulating film 53 is, for example, a silicon oxide film. The FE insulating film 53 is formed leaving spaces inside the source trenches ST, respectively.

Figure 3B:
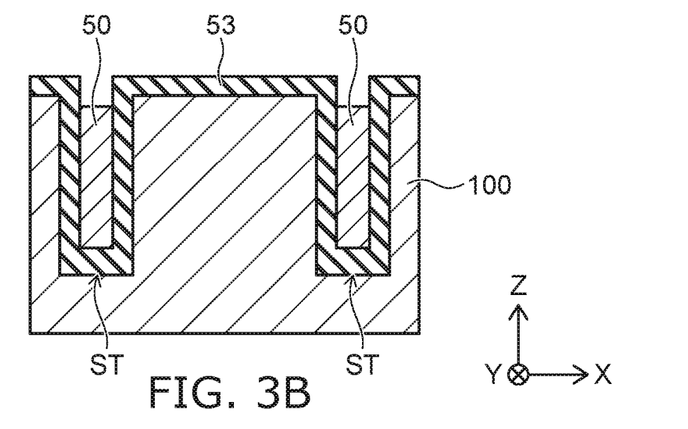

As shown in FIG. 3B, the FEs 50 are formed inside the source trenches ST. The FEs 50 are, for example, conductive polysilicon. The FEs 50 is formed by depositing the polysilicon on the semiconductor wafer 100 using, for example, CVD (Chemical Vapor Deposition) and then by etching back the polysilicon so that the portions thereof remain inside the source trench ST.

Figure 3C:
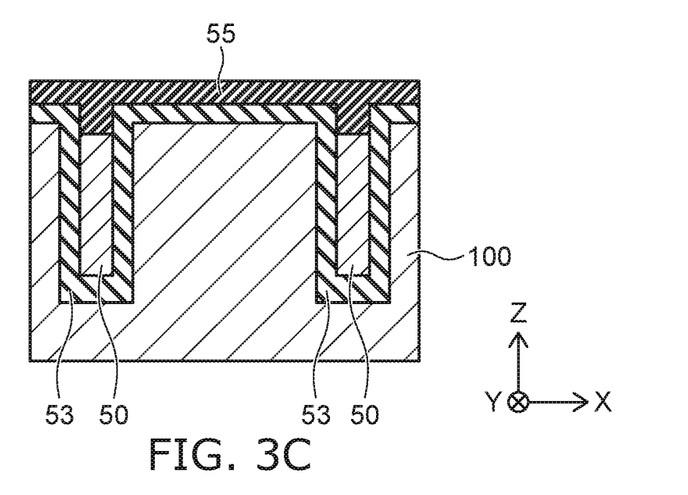

As shown in FIG. 3C, an insulating film 55 is formed so that the FEs 50 are sealed inside the source trenches ST. The insulating film 55 is a silicon oxide film formed using, for example, CVD.

Figure 4A:
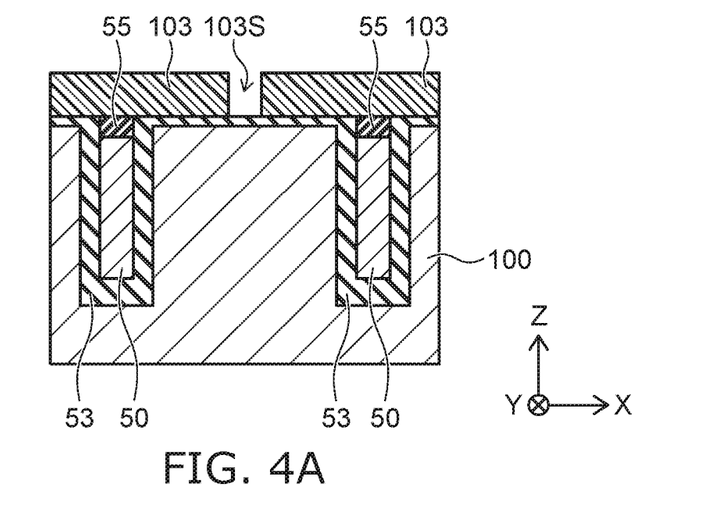

As shown in FIG. 4A, a resist mask 103 is formed on the semiconductor wafer 100 after the insulating film 55 is etched back so that the portions thereof remain at the openings of the source trenches ST, respectively. The resist mask 103 includes an opening 103S.

Figure 4B:
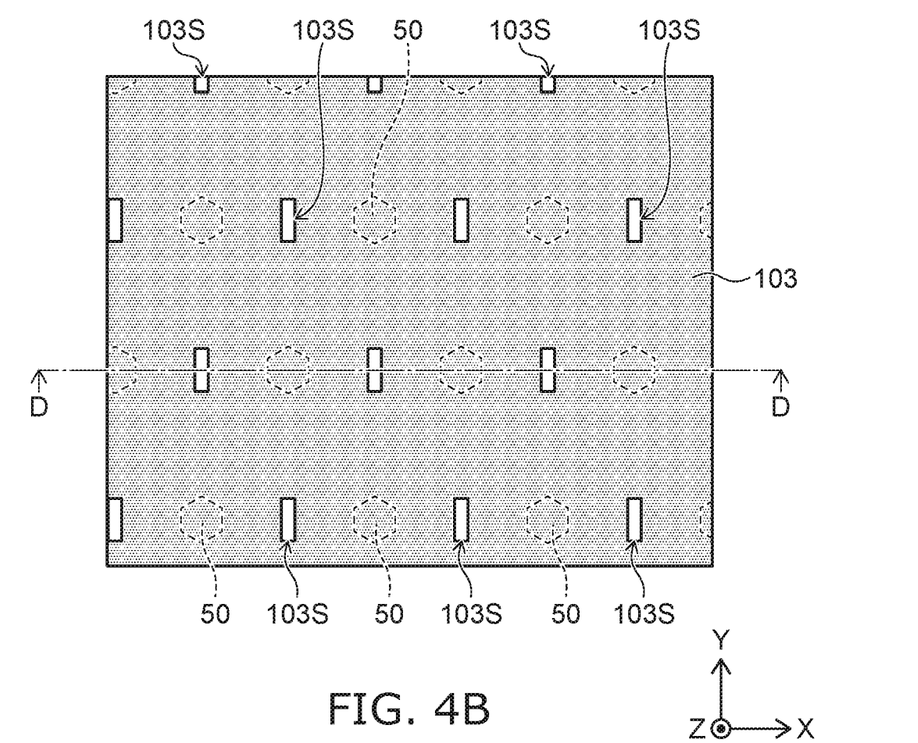

As shown in FIG. 4B, the multiple openings 103S of the resist mask 103 are provided above regions where the gate trenches GT1 are formed (see FIG. 2A). The resist mask 103 is formed to cover the source trenches ST including the FEs 50.

Figure 5A:
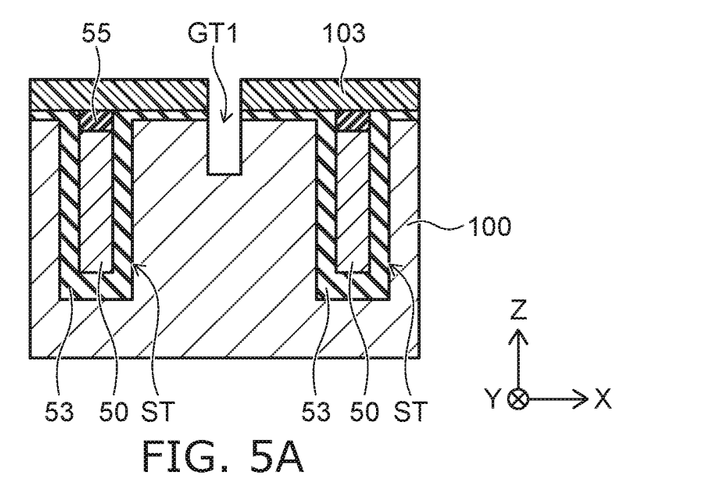

As shown in FIG. 5A, the gate trench GT1 is formed by etching using the resist mask 103. The gate trench GT1 is formed by selectively removing the FE insulating film 53 and the semiconductor wafer 100 using, for example, anisotropic RIE. The gate trench GT1 is formed to have a depth shallower than a depth of the source trenches ST.

Figure 5B:
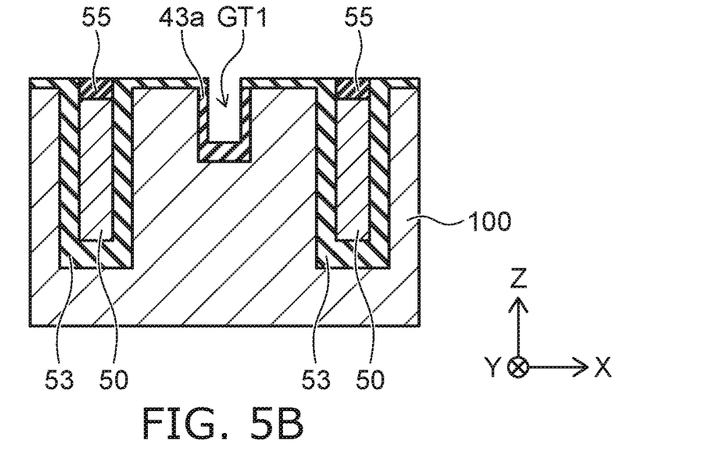

As shown in FIG. 5B, a gate insulating film 43a is formed to cover the inner surface of the gate trench GT1. The gate insulating film 43a is formed, for example, by thermally oxidizing the semiconductor wafer 100 after removing the resist mask 103. The gate insulating film 43a is, for example, a silicon oxide film.

Figure 6A:
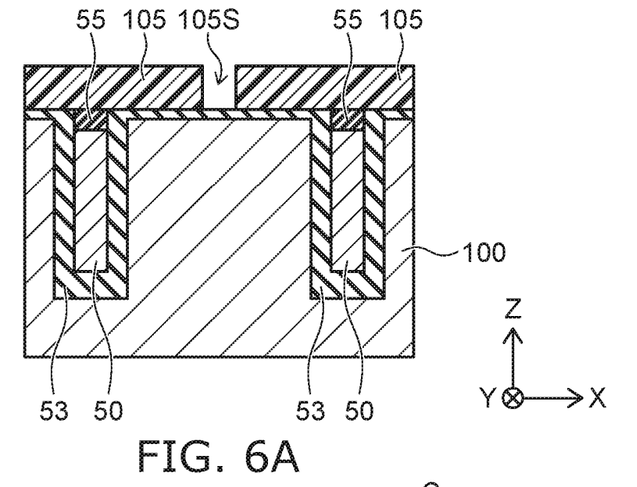

As shown in FIG. 6A, a resist mask 105 is formed on the semiconductor wafer 100 after the gate insulating film 43a is formed inside the gate trench GT1. The resist mask 105 includes an opening 105S.

Figure 6B:
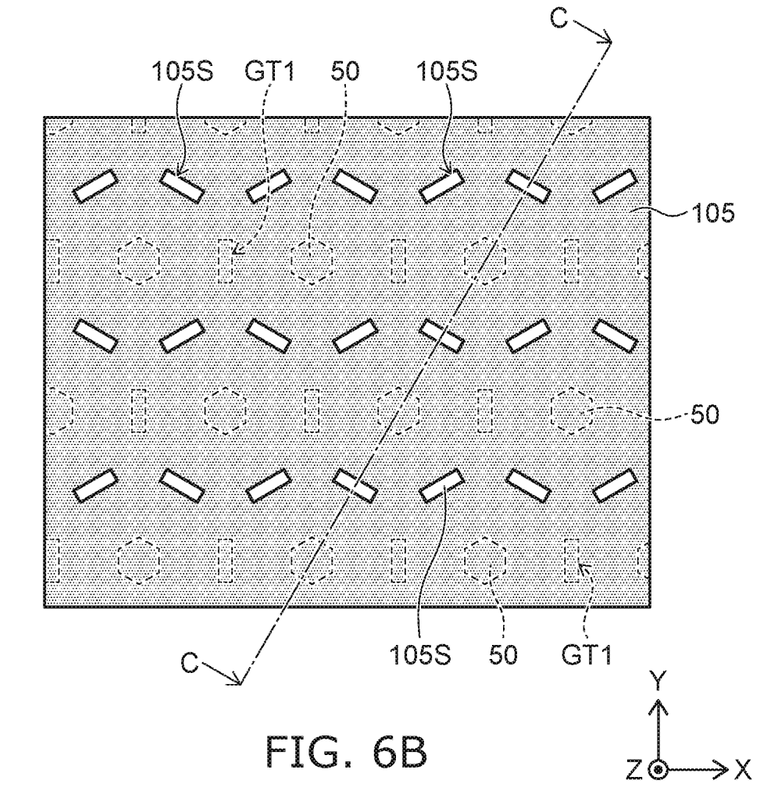

As shown in FIG. 6B, multiple openings 105S of the resist mask 105 are provided above the regions where the gate trenches GT2 (see FIG. 2A) are formed. The resist mask 105 is formed to cover the gate trenches GT1 and the source trenches ST including the FEs 50.

Figure 7A:
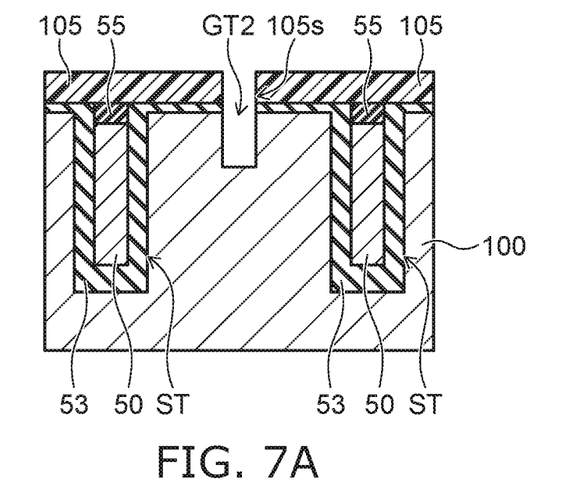

As shown in FIG. 7A, the gate trench GT2 is formed by etching using the resist mask 105. The gate trench GT2 is formed by selectively removing the FE insulating film 53 and the semiconductor wafer 100 using, for example, anisotropic RIE. The gate trench GT2 is formed to have a depth shallower than the depth of the source trench ST.

Figure 7B:
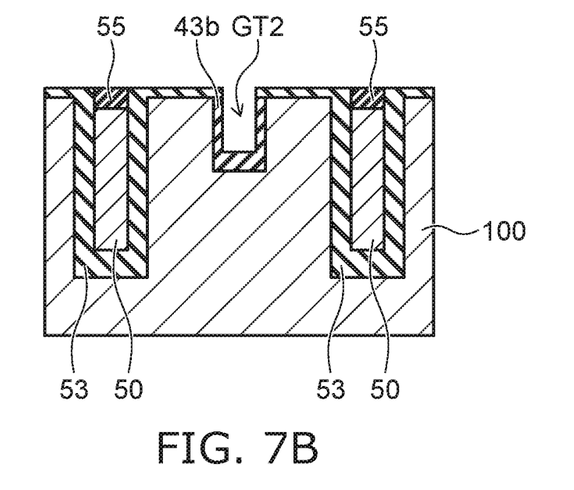

As shown in FIG. 7B, a gate insulating film 43b is formed to cover the inner surface of the gate trench GT2. The gate insulating film 43b is formed, for example, by thermally oxidizing the semiconductor wafer 100 after removing the resist mask 105. The gate insulating film 43b is, for example, a silicon oxide film. At this time, the thermal oxidation of the semiconductor wafer 100 also proceeds inside the gate trench GT1, thereby increasing the film thickness of the gate insulating film 43a.

For example, the (100) crystal plane of the semiconductor wafer 100 is exposed inside the gate trench GT1, and the (470) crystal plane is exposed inside the gate trench GT2 (see FIG. 2B). When thermally oxidizing the semiconductor wafer 100 is performed with the same time, the thermal oxide film formed on the (470) crystal plane has a thickness larger than the thickness of the thermal oxide film formed on the (100) crystal plane.

In the embodiment, the gate insulating film 43a is initially formed inside the gate trench GT1 by the first thermal oxidation, and thickened by the second thermal oxidation. That is, by making the thermal oxidation time longer in the trench gate GT1, the gate insulating film 43a is formed to have the same thickness as the thickness of the gate insulating film 43b formed inside the gate trench GT2.

For example, the gate insulating film 43b is formed with a predetermined thickness inside the gate trench GT2 through the second thermal oxidization process. Inside the gate trench GT1, the gate insulating film 43a is formed to have the predetermined thickness through the first and second thermal oxidization processes. That is, the first thermal oxidization is performed under the condition (for example, time) adjusted in advance so that the film thickness of the gate insulating film 43a after the second thermal oxidization is the same as the film thickness of the gate insulating film 43b. Thereby, it is possible to provide the gate electrodes 40 with the uniform threshold voltages by suppressing the difference in the film thickness between the gate insulating film 43a inside the gate trench GT1 and the gate insulating film 43b inside the gate trench GT2.

Figure 8A:
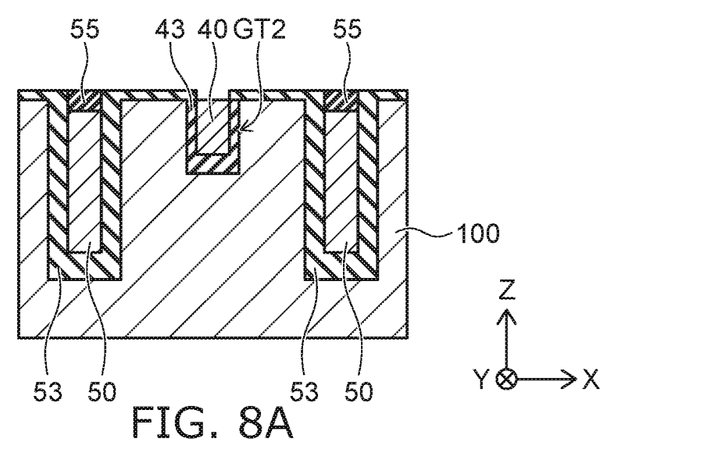

As shown in FIG. 8A, the gate electrode 40 is formed inside the gate trench GT. The gate electrode 40 is formed using, for example, CVD. The gate electrode 40 is formed by depositing a conductive polysilicon layer to fill the gate trench GT, and then etching back the polysilicon layer so that a portion thereof remains inside the gate trench GT.

Figure 8B:
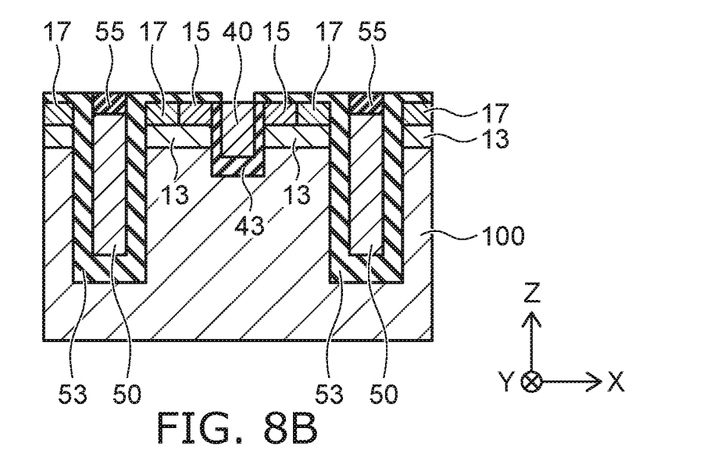

As shown in FIG. 8B, the p-type diffusion layer 13, the n-type source layer 15, and the p-type contact layer 17 are formed at the front surface side of the semiconductor wafer 100.

The p-type diffusion layer 13 is formed, for example, by ion-implanting a p-type impurity such as boron (B) into the semiconductor wafer 100 and then by activating and diffusing the p-type impurity in the heat treatment. The p-type diffusion layer 13 is formed so that the bottom thereof is positioned at a level shallower than a level of the lower end of the gate electrode 40 (i.e., closer to the front surface of the semiconductor wafer 100).

The n-type source layer 15 and the p-type contact layer 17 are formed by ion-implanting n-type impurity such as arsenic (As), and by ion-implanting a p-type impurity such as boron (B) into the semiconductor wafer 100, respectively. The impurities forming the n-type source layer 15 and the p-type contact layer 17 are activated by the heat treatment with the shorter time than the time for heat treating the p-type impurity in the p-type diffusion layer 13. The n-type source layer 15 and the p-type contact layer 17 are formed shallower than the p-type diffusion layer 13 by suppressing the impurity diffusion.

Figure 8C:
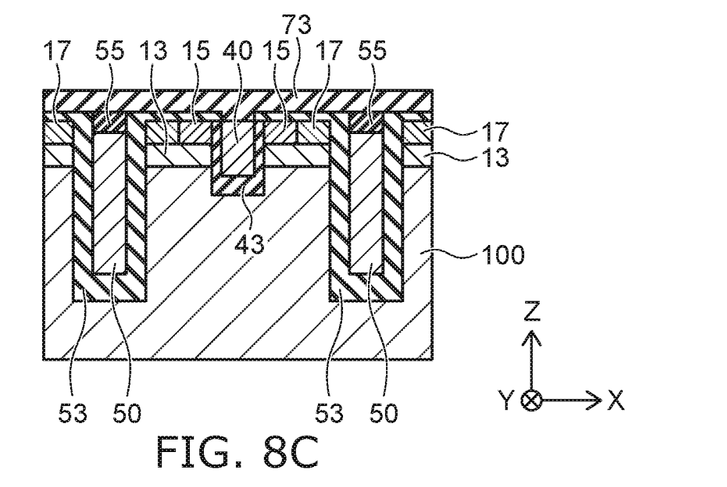

As shown in FIG. 8C, the interlayer insulating film 73 is formed to cover the gate electrode 40. The interlayer insulating film 73 is for example, a silicon oxide film deposited using CVD. The interlayer insulating film 73 is formed to cover the entire surface of the semiconductor wafer 100.

Figure 9A:
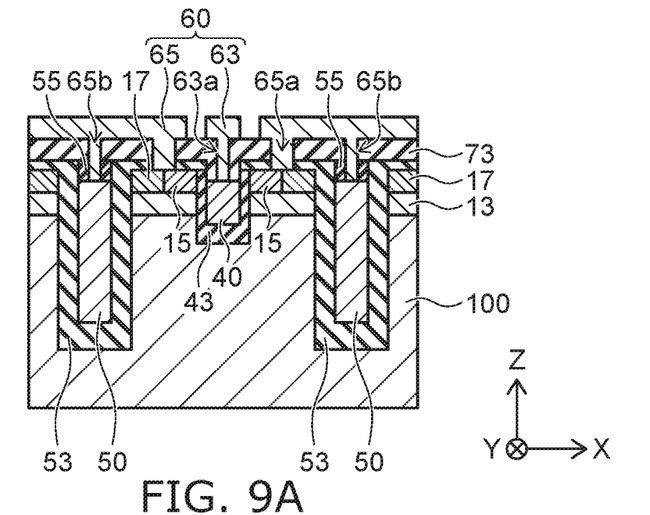

As shown in FIG. 9A, the interconnect layer 60 is formed at the front surface side of the semiconductor wafer 100. The interconnect layer 60 includes, for example, the gate interconnect 63 and the source interconnect 65. The interconnect layer 60 includes, for example, tungsten (W) and aluminum (Al). After the contact holes, which are in communication with the n-type source layer 15, the p-type contact layer 17, the gate electrode 16 and the FE 50, are formed from the upper surface of the interlayer insulating film 73, the contact holes are filled with metal such as tungsten (W) or the like deposited by CVD. Then, an aluminum layer is deposited by a sputtering method, and patterned to form the interconnect layer 60.

The gate interconnect 63 is electrically connected to the gate electrode 40 through a contact portion 63a extending through the interlayer insulating film 73. The source interconnect 65 is electrically connected to the n-type source layer 15, the p-type contact layer 17 and the FE 50. The source interconnect 65 includes the contact portions 65a and 65b. The contact portion 65a is connected to the n-type source layer 15 and the p-type contact layer 17, and the contact portion 65b is connected to the FE 50.

Figure 9B:
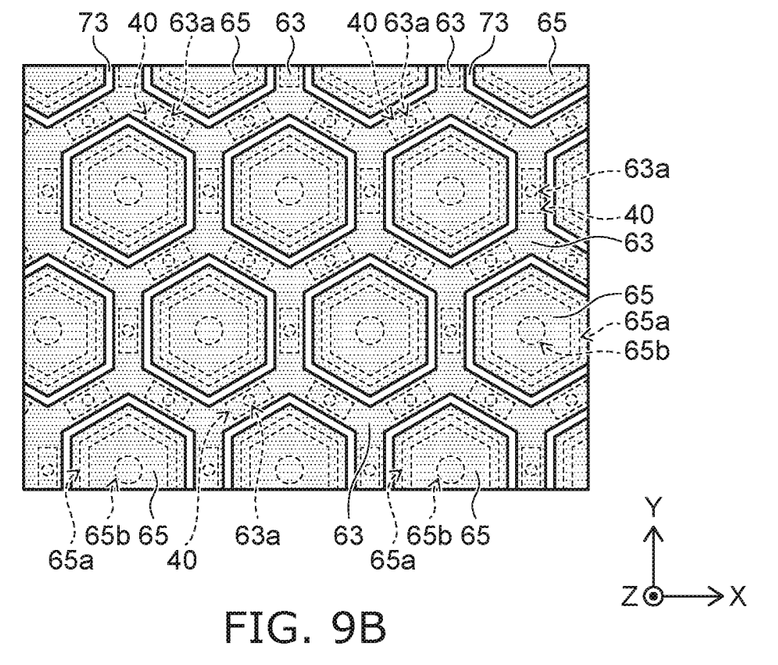

As shown in FIG. 9B, the gate interconnect 63 and the multiple source interconnects 65 are provided in the interconnect layer 60 so that the gate interconnect 63 surrounds the source interconnects 65. For example, the gate interconnect 63 are formed with one body and electrically connected to a gate pad (not shown).

Figure 10A:
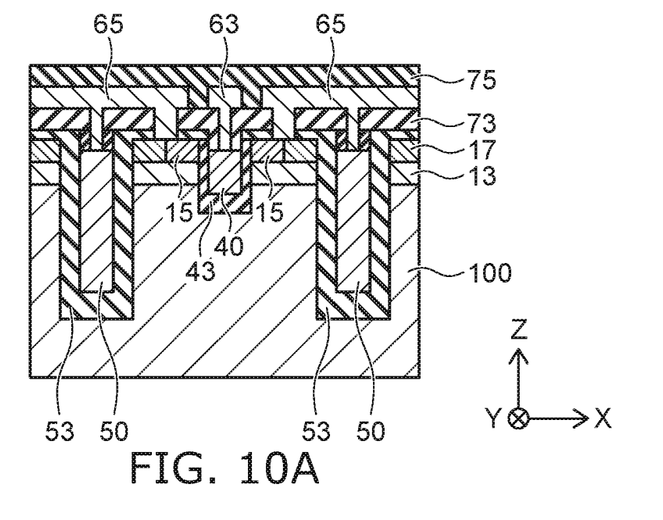

As shown in FIG. 10A, the interlayer insulating film 75 is formed to cover the interconnect layer 60. The gate interconnect 63 is electrically isolated from the source interconnect 65 by the interlayer insulating film 75. The interlayer insulating film 75 is a silicon oxide film formed by using, for example, CVD.

Figure 10B:
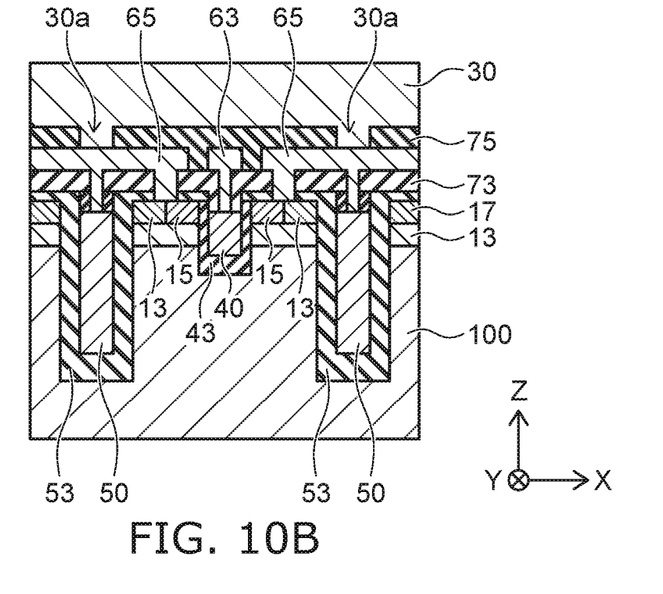

As shown in FIG. 10B, after the contact holes in communication with the source interconnect 65 is formed in the first interlayer insulating film 75, the source electrode 30 is formed to cover the interlayer insulating film 75. The source electrode 30 includes contact portions 30 filling the contact holes. The source electrode 30 is a metal layer containing aluminum, for example, and is formed using CVD.

The gate interconnect 63 is electrically isolated from the source electrode 30 by the interlayer insulating film 75. The source interconnects 65 are electrically connected to the source electrode 30 via the contact portions 30a.

Subsequently, the semiconductor wafer 100 is thinned at the back surface side by grinding or polishing. Further, an n-type impurity are ion-implanted at the back surface side of the semiconductor wafer 100 to form the n-type drain layer 19, and thereby, the n-type drift layer 11 is formed between the p-type diffusion layer 13 and the n-type drain layer 19 (see FIG. 1). Further, the drain electrode 20 in contact with the n-type drain layer 19 is formed to complete the semiconductor device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a semiconductor part having a plurality of first trenches and a second trench, the plurality of first trenches being spaced from each other and arranged around the second trench;
   a first electrode provided above the semiconductor part, the first electrode provided over the plurality of first trenches and the second trench;
   a plurality of control electrodes provided in the plurality of first trenches, respectively, the plurality of control electrodes each being electrically isolated from the semiconductor part by a first insulating film; and
   a second electrode provided in the second trench, the second electrode being electrically isolated from the semiconductor part by a second insulating film, the second electrode being electrically connected to the first electrode, and
   a first interconnect provided between the first electrode and the control electrodes, the first interconnect being electrically isolated from the first electrode by a third insulating film, the control electrodes being electrically connected to the first interconnect,
   the semiconductor part including a first semiconductor layer of a first conductivity type, a second semiconductor layer of a second conductivity type and a third semiconductor layer of the first conductivity type,
   the second semiconductor layer being provided between the first semiconductor layer and the first electrode, the second semiconductor layer facing the plurality of control electrodes with the first insulating layer interposed, the second semiconductor layer facing the second electrode with the second insulating film interposed,
   the third semiconductor layer being selectively provided between the second semiconductor layer and the first electrode, the third semiconductor layer contacting the first insulating film and being electrically connected to the first electrode.

2. The device according to claim 1, wherein two control electrodes of the plurality of control electrodes are arranged along a front surface of the semiconductor part, and the second electrode is provided between the two control electrodes.

3. The device according to claim 2, wherein the plurality of control electrodes another two control electrodes, the second electrode being provided between said another two electrodes;
   the two control electrodes are arranged in the direction perpendicular to a (100) crystal plane of the semiconductor part; and
   said another two control electrodes are arranged in a direction perpendicular to a (470) crystal plane of the semiconductor part.

4. The device according to claim 1, further comprising:
   a second interconnect provided between the first electrode and the second electrode and between the first electrode and the third semiconductor layer, the second interconnect being spaced from the first interconnect, the second interconnect being electrically connected to the second electrode and the third semiconductor layer, the first electrode being electrically connected to the second electrode and the third semiconductor layer via the second interconnect.

5. The device according to claim 4, wherein the semiconductor part further includes a fourth semiconductor layer of the second conductivity type selectively provided between the second semiconductor layer and the first electrode, the fourth semiconductor layer contacting the second insulating film, and the first electrode is electrically connected to the fourth semiconductor layer via the second interconnect.

6. The device according to claim 4, wherein the first interconnect is provided to surround the second interconnect.

7. The device according to claim 1, wherein the control electrodes and the second electrode each have a lower end positioned in the first semiconductor layer, and the second electrode has the lower end in a direction from the third semiconductor layer toward the first semiconductor layer, the lower end of the second electrode being positioned at a level deeper than the lower ends of the control electrodes in the same direction.

8. A method of manufacturing a semiconductor device, the method comprising:
   forming a first gate-trench in a semiconductor wafer, a first surface of a first crystal plane exposed at an inner surface of the first gate-trench;
   forming a first oxide film on the first surface through a first thermally-oxidizing process of the semiconductor wafer;
   forming a second gate-trench in the semiconductor wafer in addition to the first gate-trench after the first thermally oxidizing process, a second surface of a second crystal plane exposed at an inner surface of the second-gate trench, the second crystal plane being different from the first crystal plane;
   forming a second oxide film on the second surface through a second thermally-oxidizing process of the semiconductor wafer, the first oxide film having a thickness increased during the second thermally-oxidizing process.

9. The method according to claim 8, wherein the second oxide film is formed to have a thickness same as the thickness of the first oxide film after the second thermally-oxidizing process.

10. The method according to claim 8, wherein the second crystal plane is a higher-order crystal plane than the first crystal plane.

11. The method according to claim 8, wherein the semiconductor wafer is thermally oxidized under a condition in which a thermal oxidation rate of the second crystal plane is higher than a thermal oxidation rate of the first crystal plane.

12. The method according to claim 8, further comprising:
    forming gate electrodes inside the first gate trench and the second gate trench, respectively.

13. The method according to claim 8, wherein the first crystal plane is a (100) plane, and the second crystal plane is a (470) plane.

* * * * *